(12) United States Patent
Hsiao

(10) Patent No.: US 6,210,176 B1
(45) Date of Patent: Apr. 3, 2001

(54) LAND GRID ARRAY CONNECTOR

(75) Inventor: Shihwei Hsiao, Tu-Chen (TW)

(73) Assignee: Hon Hai Precision Ind. Co., Ltd., Taiepi Hsien (TW)

( * ) Notice: Subject to any disclaimer, the term of this patent is extended or adjusted under 35 U.S.C. 154(b) by 0 days.

(21) Appl. No.: 09/443,063

(22) Filed: Nov. 18, 1999

(51) Int. Cl.[7] .................................................. H01R 12/22
(52) U.S. Cl. ............................ 439/71; 439/66; 439/83
(58) Field of Search ............................ 439/66, 71, 83, 439/862

(56) References Cited

U.S. PATENT DOCUMENTS 5,378,160  *  1/1995  Yumiba et al. ...................... 439/66
5,653,598  *  8/1997  Grabbe ................................ 439/66
5,984,693  * 11/1999  McHugh et al. ...................... 439/66

* cited by examiner

Primary Examiner—Gary F. Paumen
(74) Attorney, Agent, or Firm—Wei Te Chung

(57) ABSTRACT

A contact comprises an engagement plate, a first curved neck and a second curved neck respectively extending from different positions of the engagement plate. A surface mount section is connected to the first curved neck and retained horizontal for mounting a solder ball thereon. A contacting section is connected to the second curved neck via a resilient arm. The resilient arm is deformable in response to an external urge to the contacting section, and a tension resulted from the deformed resilient arm is fully absorbed by the engagement plate.

2 Claims, 6 Drawing Sheets

LAND GRID ARRAY CONNECTOR

BACKGROUND OF THE INVENTION

1. Field of the Invention

The present invention relates to a land grid array (LGA) connector for electrically connecting a CPU to a printed circuit board, especially an LGA connector combined with land grid array and ball grid array techniques and having a strain relief structure preventing solder balls from being damaged by an urging force which is required in the LGA technique.

2. The Prior Art

Land grid array (LGA) connectors are commonly used with IC packages and do not require soldering procedures during engagement between the LGA connector and a related printed circuit board (PCB). Normally, an LGA assembly includes an IC package having a plurality of flat contact pads formed on a bottom surface thereof, a connector having an insulative housing and defining a plurality of passageways therethrough, and a plurality of conductive contacts received in the passageways of the connector. Fastening means comprises a top plate positioned on a top surface of the IC package, a bottom plate positioned on a bottom surface of the PCB, and a plurality of sets of aligned holes defined through the PCB. The fastening means is used to configure the assembly. Each set of aligned holes receives a screw therein which engages with a washer and a nut thereby sandwiching the LGA assembly between the top and bottom plates of the fastening means.

U.S. Pat. No. 5,653,598 discloses an electrical contact for use in a connector 30 between mutually opposed electrical interfaces 40, 99 such as contact pads respectively formed on an IC package 2 and a printed circuit board 9, as shown in FIG. 8. The conventional contact comprises a generally planar contact body 10 having first and second major faces 110, 120. The body includes a pair of spaced apart spring arms 140, 150 connected by a resilient bight portion 160. The spring arms 140, 150 each have a free end with an outwardly facing edge forming a contact nose 17, 18 for engaging with the corresponding interface 40, 99. Shorting sections 19, 20 generally extend toward each other from the free ends and are offset such that, upon deflection of the spring arms 140, 150 toward each other, the shorting sections 19, 20 overlap and the first major face 110 engages the second major face 120. Thus, a shortened electrical path is formed between the contact noses 17, 18 when the package 2 is urged against the connector 30.

The shorting sections 19, 20 may not properly contact each other due to unwanted lateral deflection thereof when the bight of the contact is deformed. Although the inner wall of the passageway receiving the contact may be used to limit the lateral deflection of the shorting sections 19, 20, unwanted scraping of the shorting sections 19, 20 against the inner wall of the passageway may occur thereby adversely affecting the proper overlap of the two shorting sections 19, 20. Proper overlap and engagement of the two shorting sections 19, 20 is difficult to achieve with this structure. Moreover, an additional contact resistance exists between the shorting sections 19, 20 thereby adversely affecting the signal transmission.

Additionally, the conventional LGA connector is in advance fixed in a motherboard via screws in a pre-assembly procedure. In a final assembly procedure, the screws have to be released first and then fastened for urging the CPU to the LGA connector. Therefore, in the total assembly procedure, the screws have to be fastened, released, and fastened again. This is cumbersome and not accepted by most mother board manufacturers.

U.S. patent application Ser. No. 09/434,593 invented by Bob McHugh, Nick Lin, Hanchen Tan, and Jwomin Wang, filed on Nov. 5, 1999 (Serial number unknown) which belongs to the same assignee with the present application, has disclosed a connector having a combined LGA/BGA structure for solving the above problems of the prior art. Such a connector comprises an insulative housing having a plurality of passageways for receiving corresponding number of contacts therein. Each contact has a contacting section for contacting with a corresponding contact pad of a CPU package which urges the connector, a surface mount section for mounting a solder ball thereon thereby connecting to a printed circuit board via the solder ball, and a resilient neck connected between the contacting section and the surface mount section for providing a tension forcing the contacting section to electrically abut against the CPU package when the contacting section is urged by the CPU package. Although this structure works well in solving the problems of the prior art, it may encounter a problem of damaging the connection of solder ball to either the connector or the printed circuit board due to the urging of the CPU package to the connector. Specifically, the solder ball is in advance soldered on the surface mount section of the contact and then experiences a reflow procedure in order to further connect to the printed circuit board. The solder ball may be forced to disconnect from either the connector or the printed circuit board thus causing malfunction when the CPU package urges the connector. It is requisite to provide a new structure to solve the problem.

SUMMARY OF THE INVENTION

The primary purpose of the present invention is to provide a combined LGA/BGA contact which includes a strain relief structure for protecting an existed soldered connection from being damaged when an external urge is applied on the contact.

Another purpose of the present invention is to provide a combined LGA/BGA connector which includes a strain relief structure in the contact thereof for protecting an existed soldered connection from being damaged when the connector is urged.

In accordance with one aspect of the present invention, a contact comprises an engagement plate, a first curved neck and a second curved neck respectively extending from different positions of the engagement plate. A surface mount section is connected to the first curved neck and retained horizontal for mounting a solder ball thereon. A contacting section is connected to the second curved neck via a resilient arm. The resilient arm is deformable in response to an external urge to the contacting section, and a tension resulted from the deformed resilient arm is fully absorbed by the engagement plate.

In accordance with another aspect of the present invention, a connector comprises an insulative housing in which a plurality of passageways are defined. A plurality of contacts are received in the passageways. Each contact comprises an engagement plate firmly retained in the passageway, a first curved neck and a second curved neck respectively extending from different positions of the engagement plate, a surface mount section connected to the first curved neck and retained horizontal for mounting a solder ball thereon, and a contacting section connected to the second curved neck via a resilient arm and extending out of the passageway. The resilient arm is deformable in response to an external urge to the contacting section, and a tension resulted from the deformed resilient arm is fully absorbed by the engagement plate.

DETAILED DESCRIPTION OF THE PREFERRED EMBODIMENT

Figure 1:
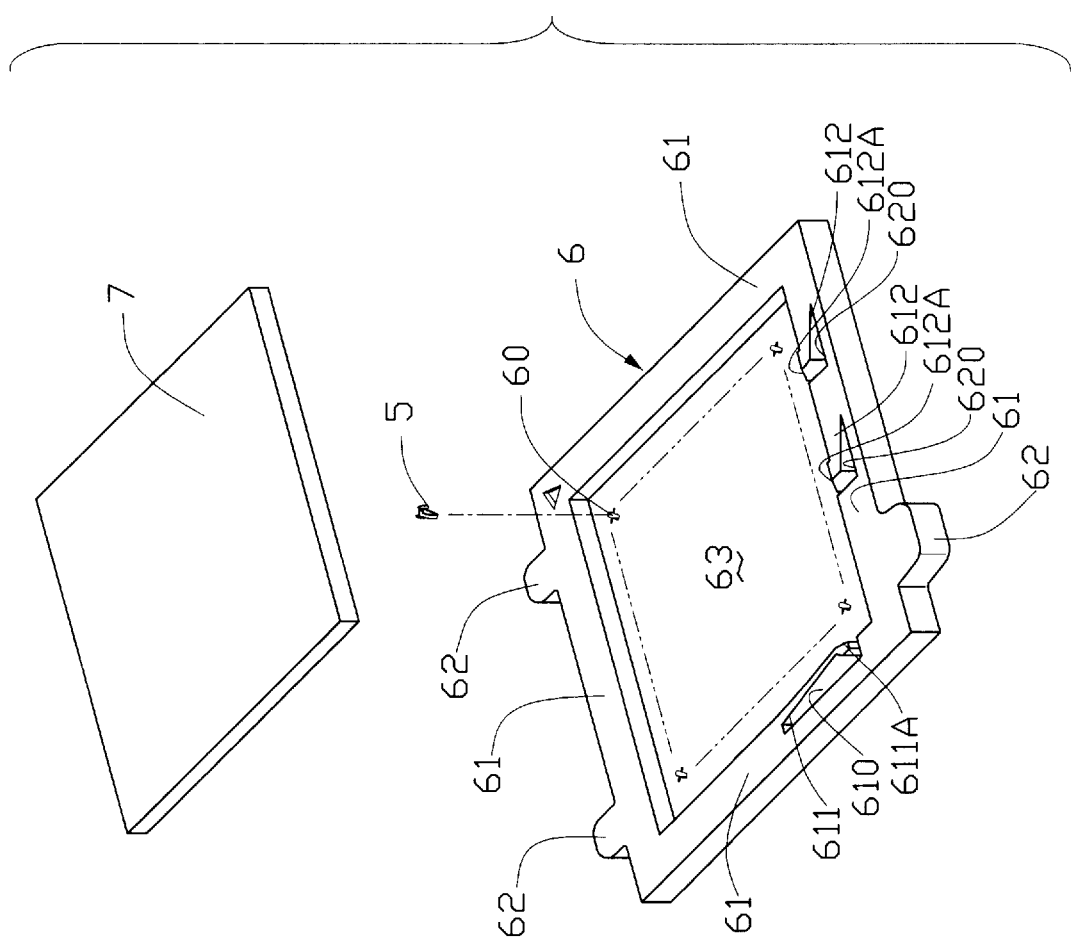
FIG. 1 is a combined LGA/BGA connector in accordance with the present invention for receiving a CPU package.
Figure 2:
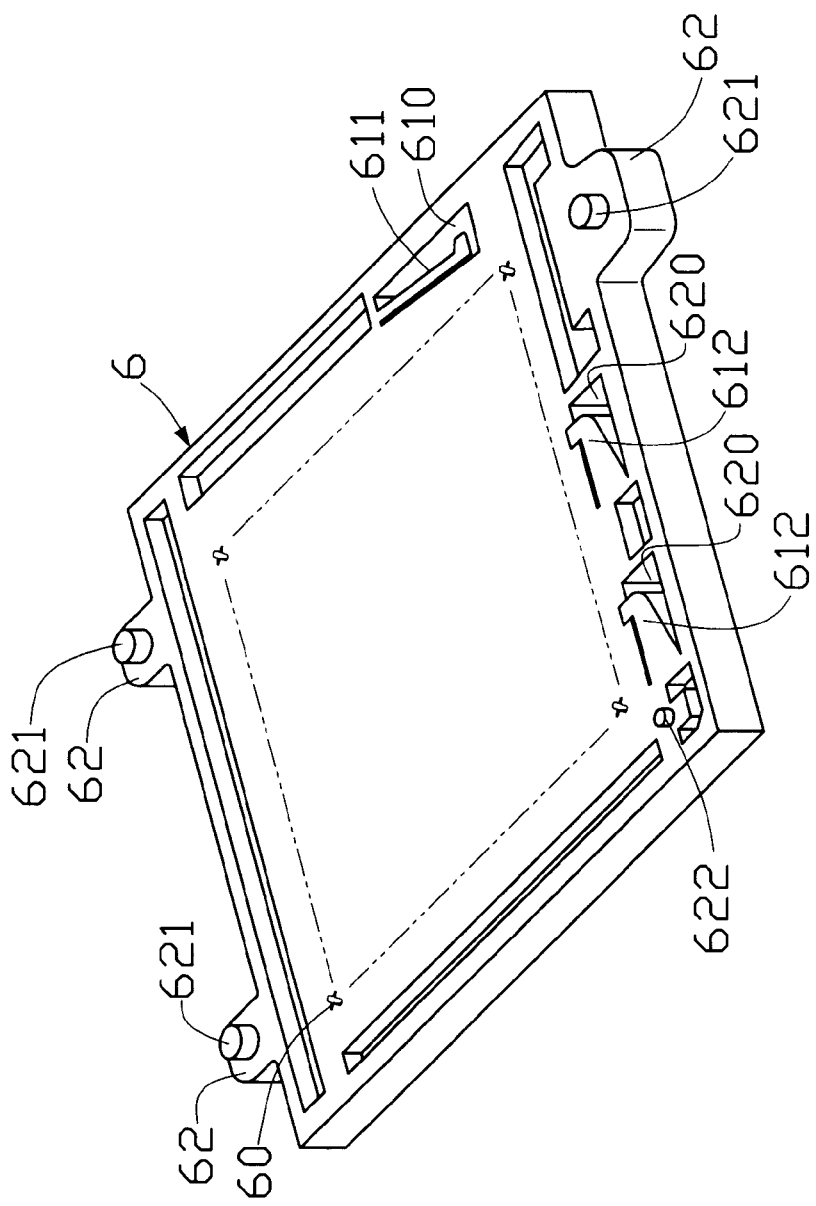
FIG. 2 is a perspective view of the LGA socket of FIG. 1 taken from an opposite direction.

Referring to FIGS. 1 and 2, a connector in accordance with the present invention comprises an insulative housing 6 defining a plurality of passageways 60 therein for receiving contacts 5. The housing 6 is substantially a body having four raised sides 61 and a central cavity 63 defined between the four raised sides 61 and sized to receive an IC package such as a CPU package 7. The passageways 60 are defined through a bottom surface of the central cavity 63. The contact 5 is received in each of the passageways 60. A first resilient arm 611 is formed in one of the four raised sides 61 and capable of deformation in a first space 610 defined in the raised side 61. Two second resilient arms 612 are formed in another raised side 61 adjacent to the one in which the first resilient arm 611 is formed. The second resilient arm 612 is capable of deformation in a second space 620 defined in the raised side 61. The first resilient arm 611 and the second resilient arms 612 each have a chamfer surface 611A, 612A respectively formed in an upper edge thereof for guiding insertion of the CPU package 7 to the central cavity 63. The CPU package 7 is fixed in the cavity 63 by normal force originated from the deformation of the resilient arms 611, 612. Three ears 62 extend from opposite raised sides 61 near three corner of the housing 6 and each ear 62 has a post 621 extending downward for engagement within openings (not shown) of a printed circuit board 9 (see FIG. 6). Similarly, an additional post 622 extending from the bottom of the housing 6 near another corner thereof for engagement within another opening (not shown) of the printed circuit board 9.

Figure 4:
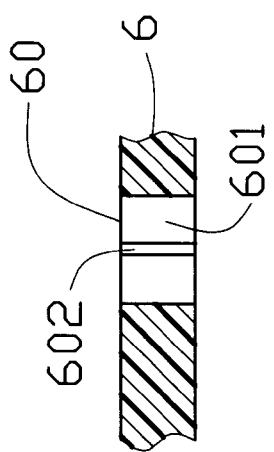
FIG. 4 is a cross-sectional view taken from line 4—4 of FIG. 3.
Figure 3:
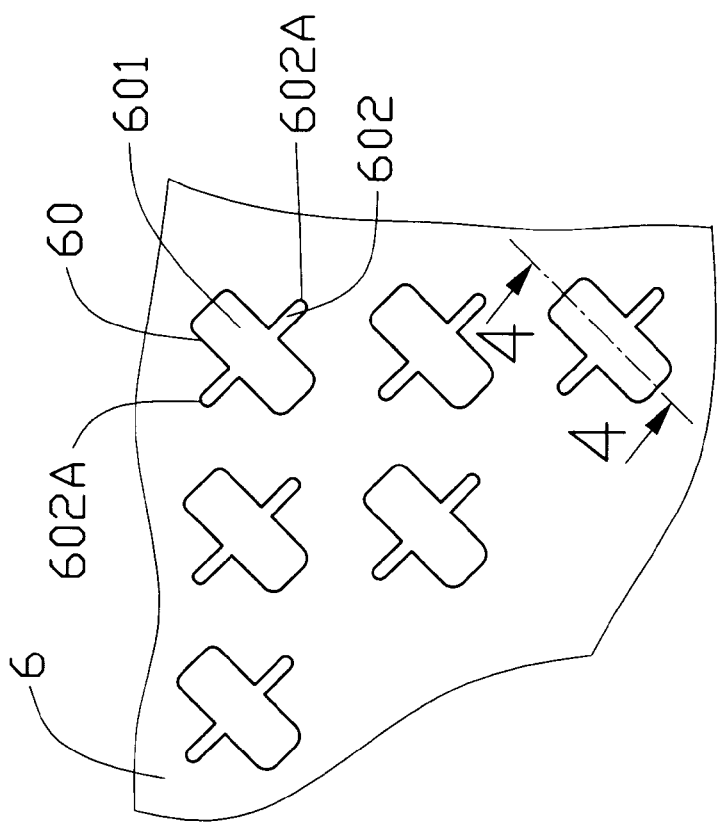
FIG. 3 is an enlarged top view of several passageways of FIG. 1.

Referring to FIGS. 3 and 4, each passageway 60 has a cross-shape in a cross-sectional view and comprises a longitudinal hole 601 and a lateral hole 602 communicating with and perpendicular to the longitudinal wide hole 601. The longitudinal hole 601 is much wider than the lateral hole 602. Two end walls 602A are defined in two ends of the lateral hole 602 for engagement purpose which will be explained later.

Figure 5:
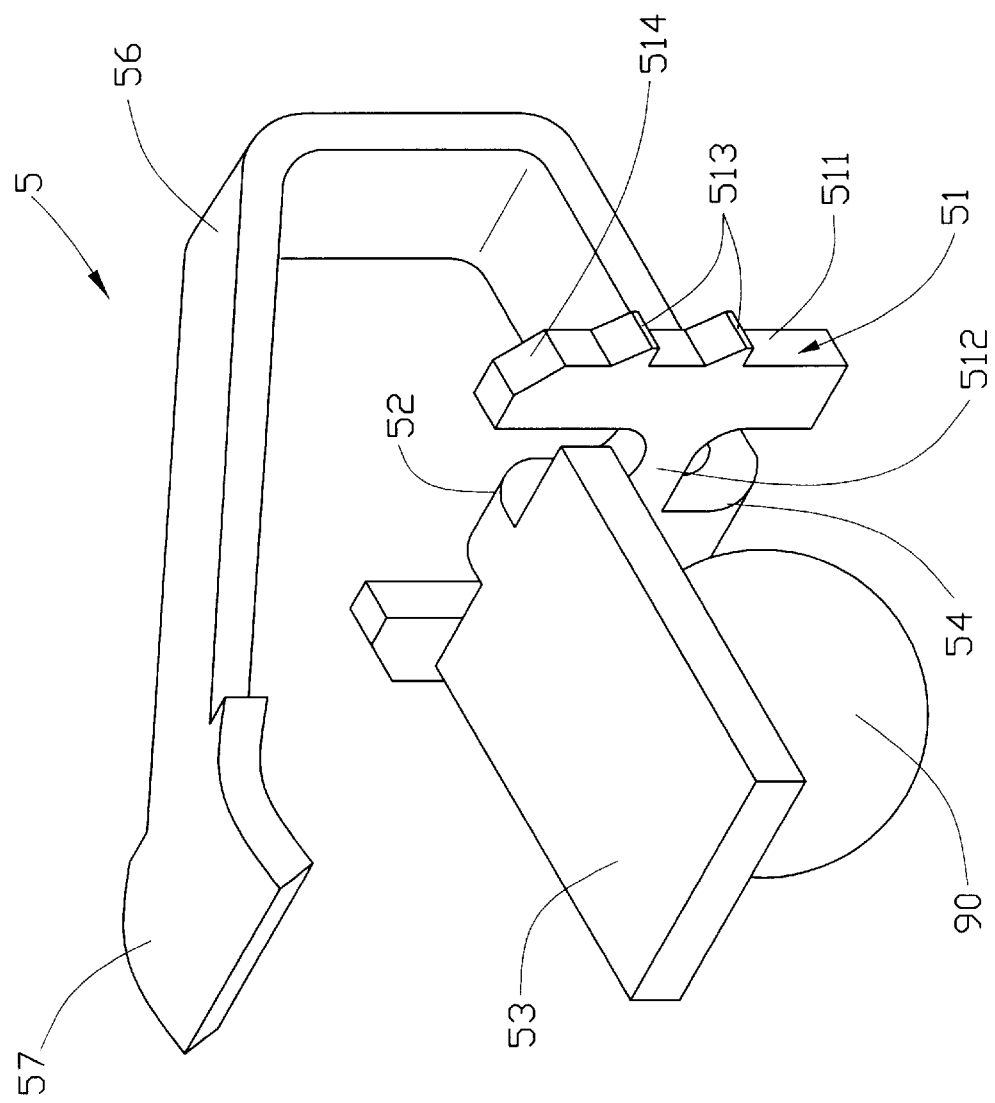
FIG. 5 is an enlarged perspective view of the contact shown in FIG. 1.
Figure 6:
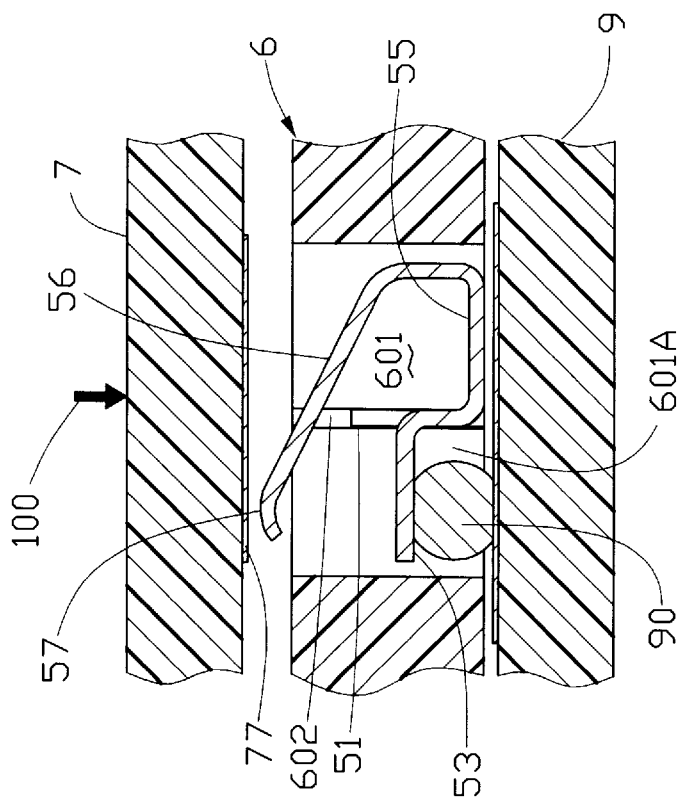
FIG. 6 is a schematic view showing that the connector of the present invention has been mounted on a printed circuit board while not yet surged by a CPU package.
Figure 8:
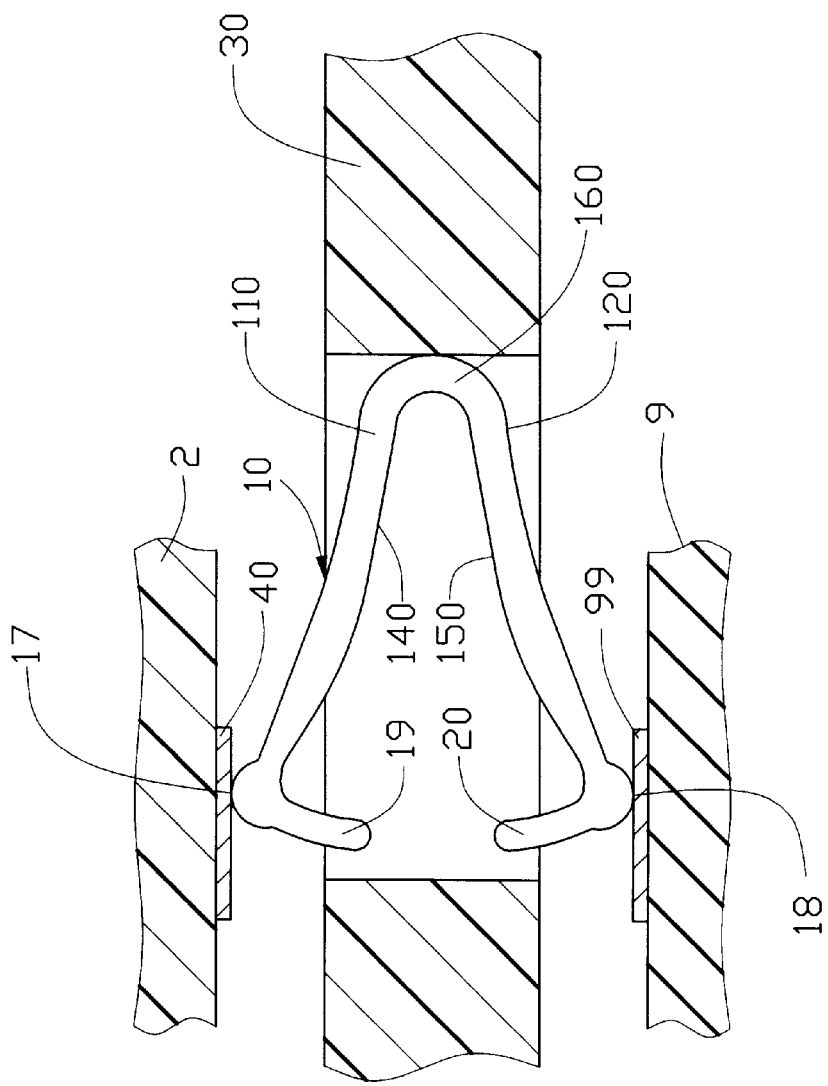
FIG. 8 is a schematic view of a conventional contact received in an LGA connector and sandwiched between a CPU package and a printed circuit board.

Referring to FIGS. 5 and 6, the CPU package 7 has a plurality of contact pads 77 (only one is shown for simplicity) and the printed circuit board 9 also has a plurality of contact pads 99 (only one is shown) and each pair of contact pads 77, 99 are arranged to register with each other when the CPU package 7 and the printed circuit board 9 sandwich the connector. The contact 5 comprises an H-shaped engagement plate 51 including two vertical sections 511 connected by a horizontal section 512, a first curved neck 52 and a second curved neck 54 respectively extending from an upper edge and a lower edge of the horizontal section 512, a surface mount section 53 connected to the first curved neck 52, a hook-shaped resilient section 56 connected to the second curved neck 54 by its lower horizontally extending section 55, and a contacting section 57 connected to an upper extending section of the hook-shaped resilient section 56. The hook-shaped resilient section 56 and the second curved neck 54 are made much narrower than the contacting section 57 for increasing their flexibility when the contacting section 57 is urged by external force. The contacting section 57 is located in the highest position of the contact 5. A reception space 601A is defined between the surface mount section 53, the curved necks 52, 54 of the contact 5, and three adjacent inner walls (not labeled) of the longitudinal wide hole 601. Each vertical section 511 has a tapered head 514 for facilitating loading of the contact 5 into the passageway 60 from a bottom direction. Each vertical section 511 has two barbs 513 formed in each side thereof for engagement with the end wall 602A (see FIG. 3) of the lateral hole 602 by interference. The surface mount section 53 is much wider than the first curved neck 52 and retains horizontal inside the longitudinal hole 601. A solder ball 90 is soldered onto the surface mount section 53 in advance and then soldered onto a solder pad 99 of a printed circuit board 9 as shown in FIG. 6. With this structure, the connector can be fixed on the printed circuit board 9 in advance via the solder balls 90. The connector together with the solder balls 90 may be maintained in a relatively low profile because the reception space 601A can accommodate most portions of the solder ball 90.

Figure 7:
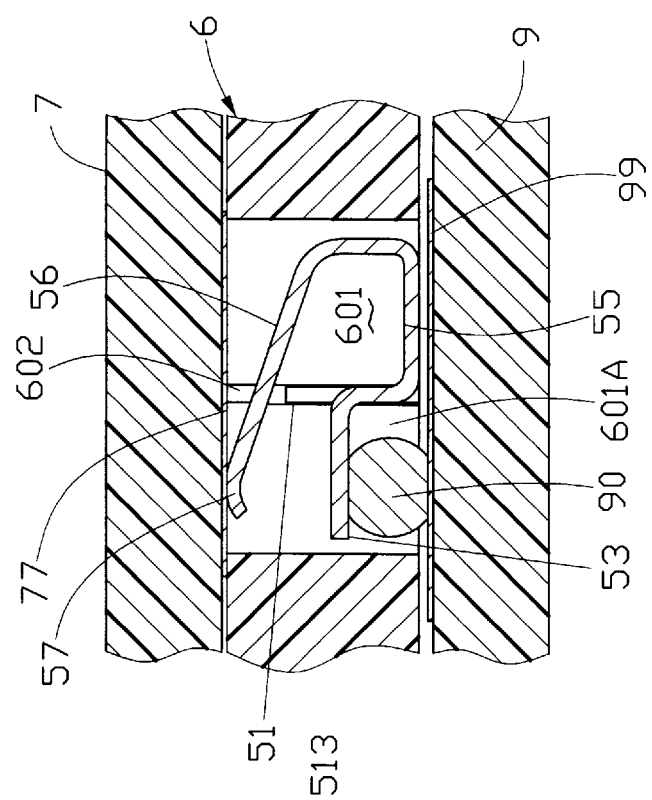
FIG. 7 is a schematic view showing that the connector has been urged by a CPU package.

Referring to FIG. 7, a CPU package 7 having contact pads 77 are urged to the contacting sections 57 of the connector in a direction 100 and each hook-shaped resilient section 56 is deformed to force the contacting section 57 to abut against the contact pad 77 of the CPU package 7 so that each contact pad 77 of the CPU package 7 is electrically connected to a corresponding one of the solder pads 99 of the printed circuit board 9. When the contacting section 57 is urged, a tension resulted from the deformation of the resilient section 56 and the second curved neck 54 will be fully absorbed by the H-shaped engagement plate 51 and the end walls 602A of the lateral hole 602. The H-shaped engagement plate 51 works well as a strain relief structure for protecting the solder ball 90 from being damaged when the connector is urged. Therefore, the connection of the solder ball 90 to either the surface mount section 53 or the solder pad 99 of the printed circuit board 9 will not be damaged when the connector is urged by the CPU package 7.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A connector comprising an insulative housing in which a plurality of passageways are defined;

a plurality of contacts are received in the passageways;

each contact comprising an engagement plate firmly retained in the passageway, a first curved neck and a second curved neck respectively extending from different positions of the engagement plate, a surface mount section connected to the first curved neck and retained horizontal for mounting a solder ball thereon, and a contacting section connected to the second curved neck via a resilient arm and extending out of the passageway;

wherein the resilient arm is deformable in response to an external urge to the contacting section, and a tension resulted from the deformed resilient arm is fully absorbed by the engagement plate;

wherein each passageway has a longitudinal hole and a lateral hole communicating with and perpendicular to the longitudinal hole;

wherein the engagement plate of the contact is firmly retained in the lateral hole of the passageway;

wherein the engagement plate is an H-shaped structure having two vertical sections connected by a horizontal section;

wherein the first curved neck and the second curved neck of the contact respectively extend from an upper edge and a lower edge of the horizontal section of the engagement plate;

wherein each vertical section of the engagement plate has at least one barb extending therefrom for engagement within the lateral hole;

wherein each vertical section of the engagement plate has a tapered head for facilitating the loading of the contact into the passageway.

2. A connector assembly comprising:

an insulative housing defining thereof a top surface and a bottom surface with a plurality of passageways therethrough;

a plurality of contacts respectively received within the corresponding passageways;

each of said contacts including:
- a vertical engagement plate defining a horizontal section thereof and positioned around a middle portion of the corresponding passageway;
- a surface mounting section extending, in a first direction away from said engagement plate, adjacent an upper edge of the horizontal section;
- a hook-shaped resilient section connected adjacent a lower edge of the horizontal section by a lower extending section thereof, said lower extending section positioned proximate the bottom surface of the housing and extending, in a second direction away from said engagement plate and opposite to said first direction, said hook-shaped resilient section further including an upper extending section positioned proximate the top surface of the housing and extending reversely in the first direction;
- a contacting section connected to a distal free end of the hook-shaped resilient section and generally positioned atop the surface mounting section; and
- a solder ball positioned on an undersurface of the surface mounting section; wherein the contacting section projects out of the top surface of the housing, and the solder ball projects out of the bottom surface of the housing;

wherein said surface mounting section extends horizontally;

wherein said lower extending section of the hook-shaped resilient section extends horizontally;

wherein said upper extending section of the hook-shaped resilient section extends obliquely.

* * * * *